United States Patent
Hui et al.

(10) Patent No.: US 12,212,925 B2
(45) Date of Patent: Jan. 28, 2025

(54) PIEZOELECTRIC MICROELECTROMECHANICAL SYSTEM CORRUGATED MICROPHONE

(71) Applicant: SKYWORKS GLOBAL PTE. LTD., Singapore (SG)

(72) Inventors: Yu Hui, Merced, CA (US); Guofeng Chen, Fremont, CA (US); Kwang Jae Shin, Yongin (KR); Myeong Gweon Gu, Seoul (KR)

(73) Assignee: SKYWORKS GLOBAL PTE. LTD., Singapore (SG)

( * ) Notice: Subject to any disclaimer, the term of this patent is extended or adjusted under 35 U.S.C. 154(b) by 145 days.

(21) Appl. No.: 17/879,933

(22) Filed: Aug. 3, 2022

(65) Prior Publication Data
US 2023/0039743 A1    Feb. 9, 2023

Related U.S. Application Data

(60) Provisional application No. 63/229,090, filed on Aug. 4, 2021.

(51) Int. Cl.
*H04R 17/02* (2006.01)
*H04R 19/00* (2006.01)

(52) U.S. Cl.
CPC ........... *H04R 19/005* (2013.01); *H04R 17/02* (2013.01); *H04R 2201/003* (2013.01)

(58) Field of Classification Search
CPC . H04R 19/005; H04R 17/02; H04R 2201/003
(Continued)

(56) References Cited

U.S. PATENT DOCUMENTS 9,055,372 B2 *   6/2015   Grosh ................... H04R 31/003
10,626,007 B2 *  4/2020   Bretthauer ............. B81B 7/008
(Continued)

FOREIGN PATENT DOCUMENTS

EP    3557881 A1    10/2019
JP    2008118639 A   5/2008
(Continued)

OTHER PUBLICATIONS

Chen et al. "Acoustic Transducers Built on Edge-released MEMS Structures," Solid-State Sensors, Actuators, and Microsystems Workshop Hilton Head Island, South Carolina, Jun. 6-10, 2010, pp. 234-237.
(Continued)

*Primary Examiner* — William J Deane, Jr.
(74) *Attorney, Agent, or Firm* — Lando & Anastasi, LLP

(57) ABSTRACT

A piezoelectric microelectromechanical system microphone comprises a support substrate, a piezoelectric element configured to deform and generate an electrical potential responsive to impingement of sound waves on the piezoelectric element, the piezoelectric element attached to the support substrate about a perimeter of the piezoelectric element, a sensing electrode disposed on the piezoelectric element and configured to sense the electrical potential, and corrugations defined in the piezoelectric element about the perimeter of the piezoelectric element to release residual stress and improve sensitivity of the piezoelectric microelectromechanical system microphone.

20 Claims, 19 Drawing Sheets

(58) Field of Classification Search
USPC .................................................. 381/114, 190
See application file for complete search history.

(56) References Cited

U.S. PATENT DOCUMENTS

| | | | |
|---|---|---|---|
| 10,964,880 | B2 | 3/2021 | Grosh et al. |
| 2011/0051985 | A1 | 3/2011 | Hwang et al. |
| 2016/0219374 | A1 | 7/2016 | Hall et al. |
| 2016/0219375 | A1 | 7/2016 | Hall et al. |
| 2017/0085994 | A1 | 3/2017 | Clerici et al. |
| 2018/0091905 | A1 | 3/2018 | Clerici et al. |
| 2019/0281393 | A1 | 9/2019 | Grosh et al. |
| 2019/0327562 | A1 | 10/2019 | Cerini et al. |
| 2020/0148532 | A1 | 5/2020 | Grosh et al. |
| 2020/0351595 | A1 | 11/2020 | Rusconi Clerici Beltrami et al. |
| 2020/0382876 | A1 | 12/2020 | Cerini et al. |
| 2021/0051413 | A1 | 2/2021 | Hui et al. |
| 2021/0084423 | A1 | 3/2021 | Rusconi Clerici Beltrami et al. |
| 2021/0120346 | A1 | 4/2021 | Hui et al. |
| 2021/0136483 | A1 | 5/2021 | Hsieh et al. |
| 2021/0385584 | A1* | 12/2021 | Goswami ............ G01P 15/0802 |
| 2022/0073342 | A1* | 3/2022 | Ho ........................ B81B 3/0021 |
| 2022/0267141 | A1 | 8/2022 | Chen et al. |
| 2022/0272459 | A1 | 8/2022 | Chen et al. |
| 2022/0332568 | A1 | 10/2022 | Barsukou |
| 2022/0402752 | A1* | 12/2022 | Goswami ................ G01P 15/18 |
| 2023/0007405 | A1 | 1/2023 | Qian et al. |
| 2023/0011561 | A1 | 1/2023 | Qian et al. |
| 2023/0012046 | A1 | 1/2023 | Qian et al. |
| 2023/0072672 | A1 | 3/2023 | Chen et al. |
| 2023/0104257 | A1 | 4/2023 | Barsukou et al. |
| 2023/0105699 | A1 | 4/2023 | Chen et al. |
| 2023/0127983 | A1 | 4/2023 | Chen et al. |
| 2023/0188896 | A1* | 6/2023 | Barsukou ................ H04R 7/06 381/91 |
| 2023/0234837 | A1 | 7/2023 | Chen et al. |
| 2023/0239641 | A1 | 7/2023 | Chen et al. |
| 2023/0303387 | A1 | 9/2023 | Barsukou |
| 2024/0098426 | A1* | 3/2024 | Barsukou ............. H10N 30/306 |

FOREIGN PATENT DOCUMENTS

| | | |
|---|---|---|
| JP | 2019140638 A | 8/2019 |
| WO | 2010003887 A1 | 1/2010 |

OTHER PUBLICATIONS

Chen et al., "Edge-released, piezoelectric MEMS acoustic transducers in array configuration," J. Micromech. Microeng. 22 (2012) 025005, pp. 1-9.

Huang et al., "High Sensitivity and High S/N Microphone Achieved by PZT Film with Central-Circle Electrode Design", IEEE, MEMS 2017, Las Vegas, NV, USA, Jan. 22-26, 2017, pp. 1188-1191.

Je et al., "In situ tuning of a MEMS microphone using electrodeposited nanostructures," Journal of Micromechanics and Microengineering, 19 (2009) 035015, pp. 1-8.

Je et al., "MEMS Capacitive Microphone with Dual-Anchored Membrane", Proceedings 2017, 1, 342; Aug. 9, 2017, 5 pages.

Knisely et al., "Method for Controlling Stress Gradients in PVD Aluminum Nitride", Journal of Micromechanics and Microengineering, vol. 28, No. 11, 2018.

Littrell, "High Performance Piezoelectric MEMS Microphones", A dissertation submitted in partial fulfillment of the requirements for the degree of Doctor of Philosophy (Mechanical Engineering) in The University of Michigan, 2010, 111 pages.

Lo et al., "Development of a No-Back-Plate SOI MEMS Condenser Microphone," IEEE, Transducers 2015, Anchorage, Alaska, Jun. 21-25, 2015, pp. 1085-1088.

Lo et al., "Sensitivity Improvement of No-Back-Plate MEMS Microphone Using Polysilicon Trench-refilled Process," IEEE, Transducers 2017, Kaohsiung, Taiwan, Jun. 18-22, 2017, pp. 1171-1174.

Mohamad et al., "Modelling and Optimisation of a Spring-Supported Diaphragm Capacitive MEMS Microphone", Engineering, 2010, 2, 762-770.

Peña-García et al., "Design and Modeling of a MEMS Dual-Backplate Capacitive Microphone with Spring-Supported Diaphragm for Mobile Device Applications," Sensors (2018), 18, 3545, 30 pages.

Pulskamp et al. "Mitigation of residual film stress deformation in multilayer microelectromechanical systems cantilever devices." Journal of Vacuum Science & Technology B: Microelectronics and Nanometer Structures Processing, Measurement, and Phenomena 21.6 (2003): 2482-2486.

Segovia-Fernandez et al., "Monolithic Piezoelectric Aluminum Nitride MEMS-CMOS Microphone", IEEE (2017), Transducers 2017, Kaohsiung, Taiwan, Jun. 18-22, 2017, pp. 414-417.

Shah et al., "Design Approaches of MEMS Microphones for Enhanced Performance", Hindawi, Journal of Sensors, vol. 2019, Article ID 9294528, Mar. 6, 2019, 26 pages.

Udvardi et al., Spiral-Shaped Piezoelectric MEMS Cantilever Array for Fully Implantable Hearing Systems. Micromachines (2017) 8, 311, 13 pages.

Williams et al., "An AlN MEMS Piezoelectric Microphone for Aeroacoustic Applications", Journal of Microelectromechanical Systems, vol. 21, No. 2, Apr. 2012, pp. 270-283.

Yamashita et al., "Diaphragm deflection control of piezoelectric ultrasonic microsensors for sensitivity improvement", Sensors and Actuators A 139 (2007), pp. 118-123.

Yan et al., "Corrugated Diaphragm for Piezoelectric Microphone", IEEE, 1996, pp. 503-506.

\* cited by examiner

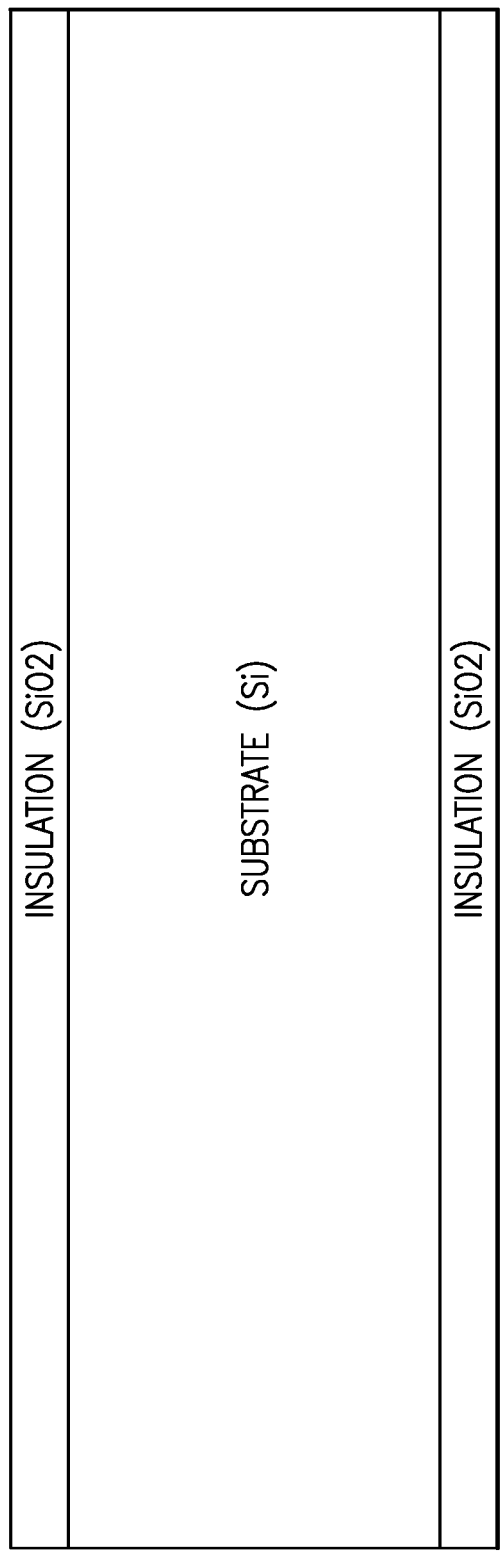

PIEZOELECTRIC MICROELECTROMECHANICAL SYSTEM CORRUGATED MICROPHONE

CROSS-REFERENCE TO RELATED APPLICATIONS

This application claims priority under 35 U.S.C. § 119(e) to U.S. Provisional Patent Application Ser. No. 63/229,090, titled "PIEZOELECTRIC MICROELECTROMECHANICAL SYSTEM CORRUGATED MICROPHONE," filed Aug. 4, 2021, the contents of which being incorporated herein by reference for all purposes.

BACKGROUND

Technical Field

Embodiments disclosed herein relate to piezoelectric microelectromechanical system microphones and to devices including same.

Description of Related Technology

A microelectromechanical system (MEMS) microphone is a micro-machined electromechanical device to convert sound pressure (e.g., voice) into an electrical signal (e.g., voltage). MEMS microphones are widely used in mobile devices such as cellular telephones, headsets, smart speakers, and other voice-interface devices/systems. Capacitive MEMS microphones and piezoelectric MEMS microphones (PMMs) are both available in the market. PMMs require no bias voltage for operation, therefore, they provide lower power consumption than capacitive MEMS microphones. The single membrane structure of PMMs enable them to generally provide more reliable performance than capacitive MEMS microphones in harsh environments. Existing PMMs are typically based on either cantilever MEMS structures or diaphragm MEMS structures. PMMs based on cantilever structures may suffer from poor low-frequency roll-off control as the gap between cantilevers varies when the cantilevers deflect due to residual stress. PMMs based on diaphragm structures may suffer from sensitivity variation and degradation if residual stress causes large tensile or compression stress to be present within the diaphragm.

SUMMARY

In accordance with one aspect, there is provided a piezoelectric microelectromechanical system microphone. The piezoelectric microelectromechanical system microphone comprises a support substrate, a piezoelectric element configured to deform and generate an electrical potential responsive to impingement of sound waves on the piezoelectric element, the piezoelectric element attached to the support substrate about a perimeter of the piezoelectric element, a sensing electrode disposed on the piezoelectric element and configured to sense the electrical potential, and corrugations defined in the piezoelectric element about the perimeter of the piezoelectric element to release residual stress and improve sensitivity of the piezoelectric microelectromechanical system microphone.

In some embodiments, the piezoelectric element has a diaphragm structure.

In some embodiments, the piezoelectric element is circular.

In some embodiments, the corrugations are defined in an anchor region of the diaphragm structure.

In some embodiments, the corrugations include portions of the piezoelectric element displaced from one another in a direction normal to a plane defined by the perimeter of the piezoelectric element.

In some embodiments, the corrugations further include a trench defined in the piezoelectric element.

In some embodiments, the corrugations further include a plurality of trenches defined in the piezoelectric element.

In some embodiments, the sensing electrode includes an inner sensing electrode disposed proximate a center of the diaphragm structure and an outer sensing electrode disposed proximate the perimeter of the diaphragm structure.

In some embodiments, the corrugations are defined in a region of the piezoelectric element surrounding the outer sensing electrode.

In some embodiments, the piezoelectric microelectromechanical system microphone further comprises an elastic layer disposed on a lower surface of the piezoelectric element.

In some embodiments, the corrugations include portions of the elastic layer displaced from one another in a direction normal to a plane defined by the perimeter of the piezoelectric element.

In some embodiments, the corrugations further include a trench defined in the elastic layer.

In some embodiments, the piezoelectric microelectromechanical system microphone further comprises a piezoelectric material layer disposed on a lower surface of the piezoelectric element.

In some embodiments, the corrugations include portions of the piezoelectric material layer displaced from one another in a direction normal to a plane defined by the perimeter of the piezoelectric element.

In some embodiments, the corrugations further include a trench defined in the piezoelectric material layer.

In some embodiments, the piezoelectric microelectromechanical system microphone is included in an electronic device module.

In some embodiments, the electronic device module in included in an electronic device.

In some embodiments, the electronic device module is included in a cellular telephone.

In accordance with another aspect, there is provided a method of forming a piezoelectric microelectromechanical system microphone. The method comprises depositing a film of piezoelectric material on a support substrate, the film of piezoelectric material secured to the support substrate about a perimeter of the film of piezoelectric material and including a central region defined within the perimeter that is free to vibrate responsive to impingement of sound waves on the central region, forming electrodes on one or both of upper and lower surfaces of the film of piezoelectric material within the central region, and forming corrugations in the film of piezoelectric material in an anchor region of the film of piezoelectric material.

In some embodiments, forming the corrugations includes forming one or more trenches in the film of piezoelectric material.

BRIEF DESCRIPTION OF THE DRAWINGS

Embodiments of this disclosure will now be described, by way of non-limiting example, with reference to the accompanying drawings.

FIG. 3A illustrates an act in forming a diaphragm PMM including corrugations as disclosed herein;

DETAILED DESCRIPTION OF CERTAIN EMBODIMENTS

Figure 1A:
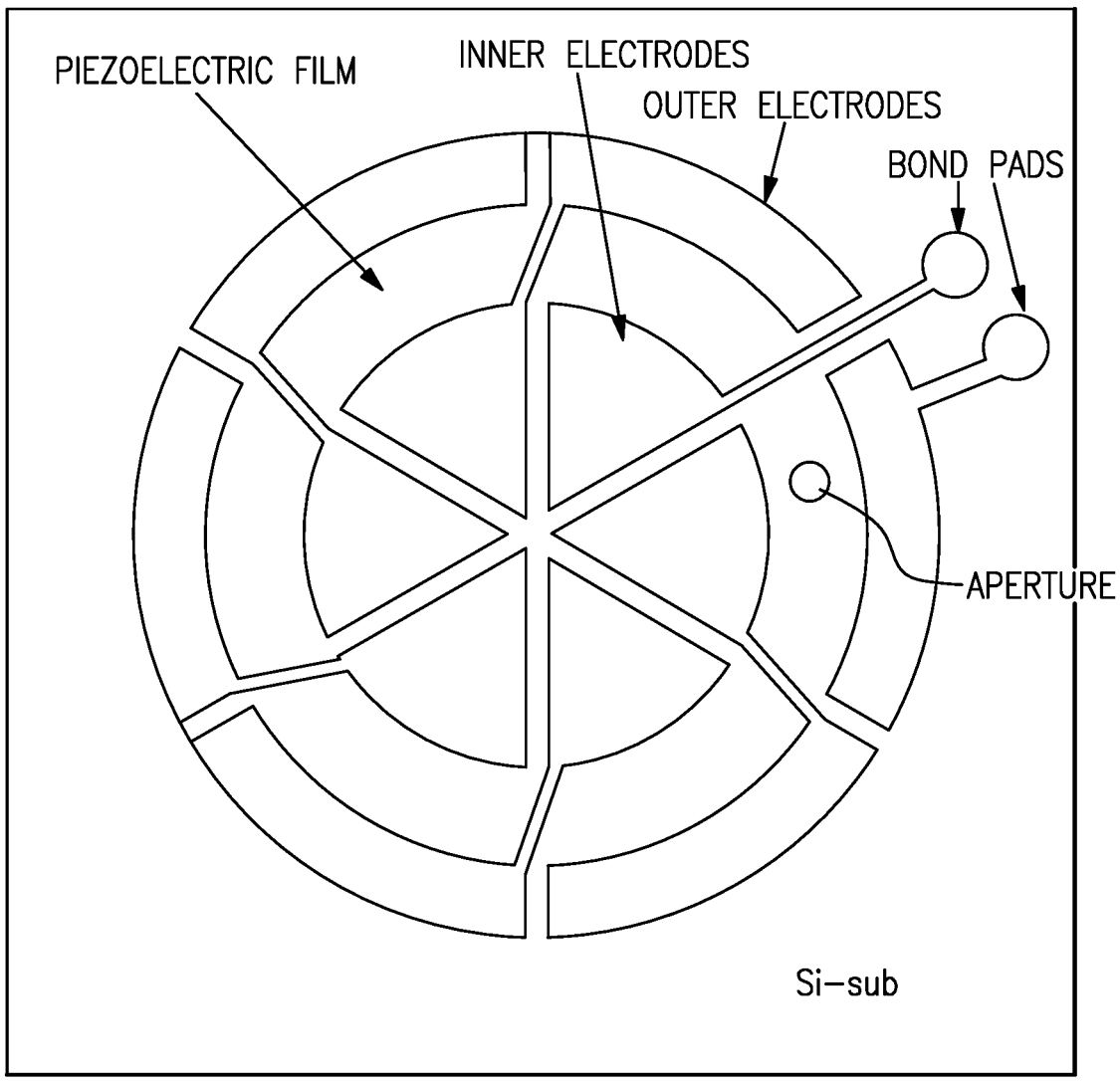
FIG. 1A is a plan view of an example of a diaphragm PMM.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Figure 1B:
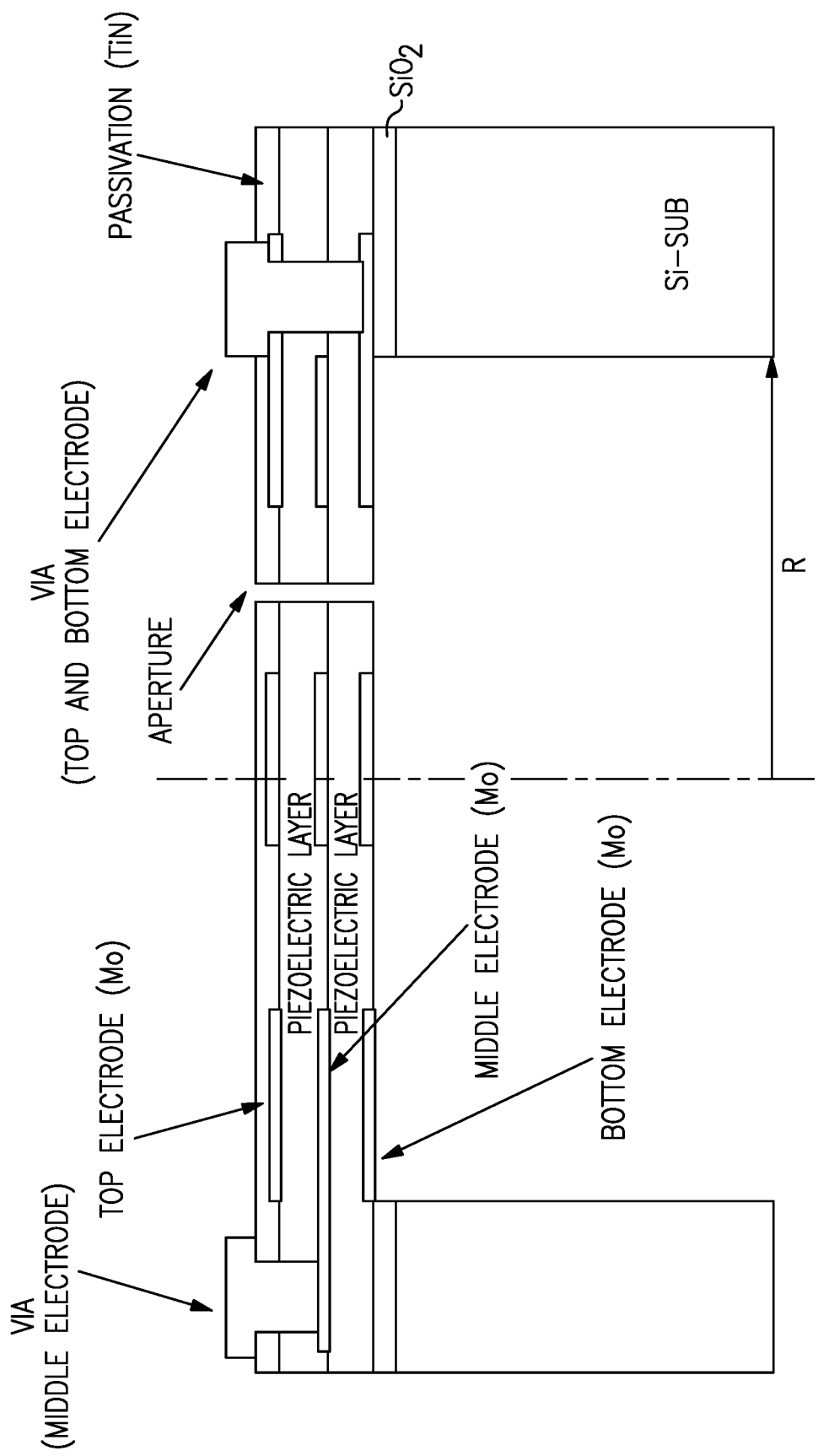
FIG. 1B is a cross-sectional view of the diaphragm PMM of FIG. 1A.

An example of a diaphragm-type piezoelectric microelectromechanical system microphone (PMM) is illustrated in a top-down plan view in FIG. 1A and in cross-sectional view in FIG. 1B.

The diaphragm of the PMM may be formed of or include a film of piezoelectric material, for example, aluminum nitride (AlN), zinc oxide (ZnO), or PZT, (also referred to herein as a piezoelectric element) that generates a voltage difference across different portions of the diaphragm when the diaphragm deforms or vibrates due to the impingement of sound waves on the diaphragm. Although illustrated as circular in FIG. 1A, the diaphragm may have a circular, rectangular, or polygonal shape. In the example of FIGS. 1A and 1B, the diaphragm structure is fully clamped all around its perimeter by adhesion of the entire perimeter of the diaphragm to a layer of $SiO_2$ disposed on a Si substrate. To improve low-frequency roll-off control ($f_{-3\ dB}$ control) one or more vent holes or apertures may be formed in the diaphragm structure that may be well defined by photolithography.

The diaphragm PMM of FIGS. 1A and 1B has a circular diaphragm formed of two layers of piezoelectric material, for example, AlN, that is clamped at its periphery on layers of $SiO_2$ formed on a Si substrate with a cavity defined in the substrate below the diaphragm. The circular diaphragm PMM includes a plurality of pie-piece shaped sensing/active inner electrodes disposed in the central region of the diaphragm that are segmented and separated from one another by gaps. Outer sensing/active electrodes, segmented and separated circumferentially from one another by gaps, are positioned proximate a periphery of the diaphragm and extend inward from the clamped periphery a portion of the radius of the diaphragm toward the inner electrodes. Each outer sensing electrode is directly electrically connected to a corresponding inner sensing electrode by an electrical trace or conductor segment. Open areas that are free of sensing/active electrodes are defined between the inner electrodes and outer electrodes.

The inner electrodes and outer electrodes each include top or upper electrodes disposed on top of an upper layer of piezoelectric material of the diaphragm and bottom or lower electrodes disposed on the bottom of the lower layer of piezoelectric material of the diaphragm. In some embodiments, as illustrated in FIG. 1B the inner electrodes and outer electrodes may further include middle electrodes disposed between the upper and lower layers of piezoelectric material. The multiple inner and outer electrodes are electrically connected in series between the two bond pads, except for inner and outer electrode segment pairs having electrical connection directly to the bond pads. The top and bottom electrodes of each inner and outer electrode segment pair are electrically connected to the middle electrode in an adjacent inner and outer electrode segment pair in embodiments including the middle electrodes. Vias to the middle electrode of one inner and outer electrode segment pair and to the top and bottom electrodes of an adjacent inner and outer electrode segment pair are used to provide electrical connection between the bond pads and electrodes. The electrodes are indicated as being Mo, but could alternatively be Ru, Pt, or any other suitable metal, alloy, or non-metallic conductive material.

Diaphragm structures generate maximum stress and piezoelectric charges in the center and near the edge of the diaphragm anchor. The charges in the center and edge have opposite polarities. Additionally, diaphragm structures generate piezoelectric charges at the top and the bottom surfaces and the charge polarities are opposite on the top and bottom surfaces in the same area. Partial sensing electrodes in the diaphragm center and near the anchor may be used for maximum output energy and sensitivity and to minimize parasitic capacitance.

A diaphragm PMM may include one, two, or multiple piezoelectric material film layers in the diaphragm. In embodiments including two piezoelectric material film layers, conductive layers forming sensing/active electrodes may be deposited on the top and the bottom of the diaphragm, as well as between the two piezoelectric material film layers, forming a bimorph diaphragm structure. Partial sensing electrodes may be employed. Inner electrodes may be placed in the center of diaphragm and outer electrodes may be placed near the anchor/perimeter of the diaphragm. Sensing/active electrodes may be placed on the bottom and top, and in the middle of the vertical extent of the multi-layer piezoelectric film forming the diaphragm. The size of the sensing/active electrodes may be selected to collect the maximum output energy ($E=0.5*C*V^2$).

It has been discovered that the sensitivity of a diaphragm PMM may be improved by providing a mechanism to at least partially relieve residual compressive or tensile stresses that may remain in the piezoelectric material of the diaphragm due to variations or imperfections in the manufacturing process for the PMM. One method of at least partially relieving residual compressive or tensile stresses that may remain in the piezoelectric material of the diaphragm is to introduce corrugations in the piezoelectric material in the anchor regions of the diaphragm that may act as springs that may compress or expand to help relieve residual stresses.

Figure 2A:
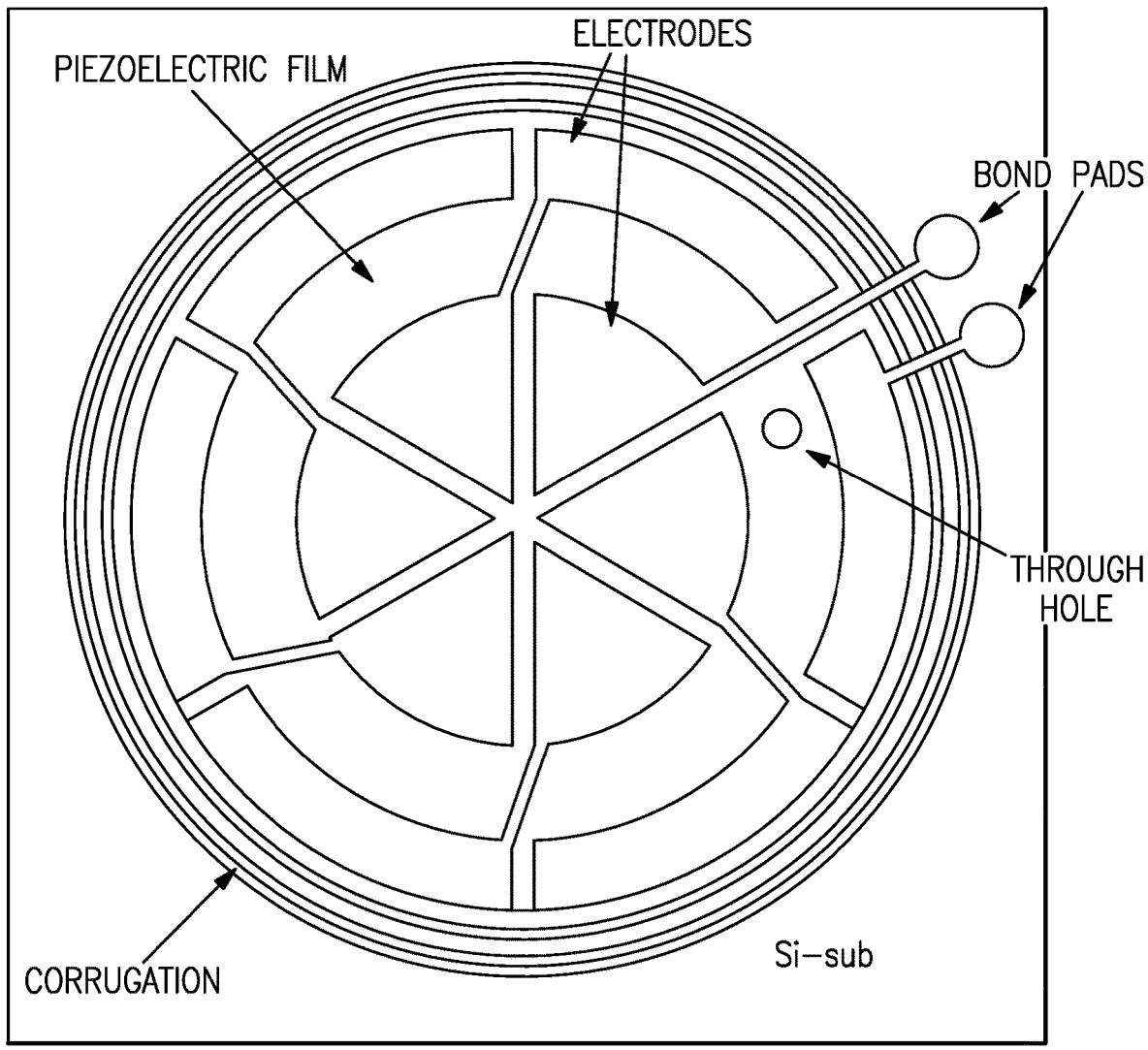
FIG. 2A is a plan view of an example of a diaphragm PMM including corrugations.
Figure 2B:
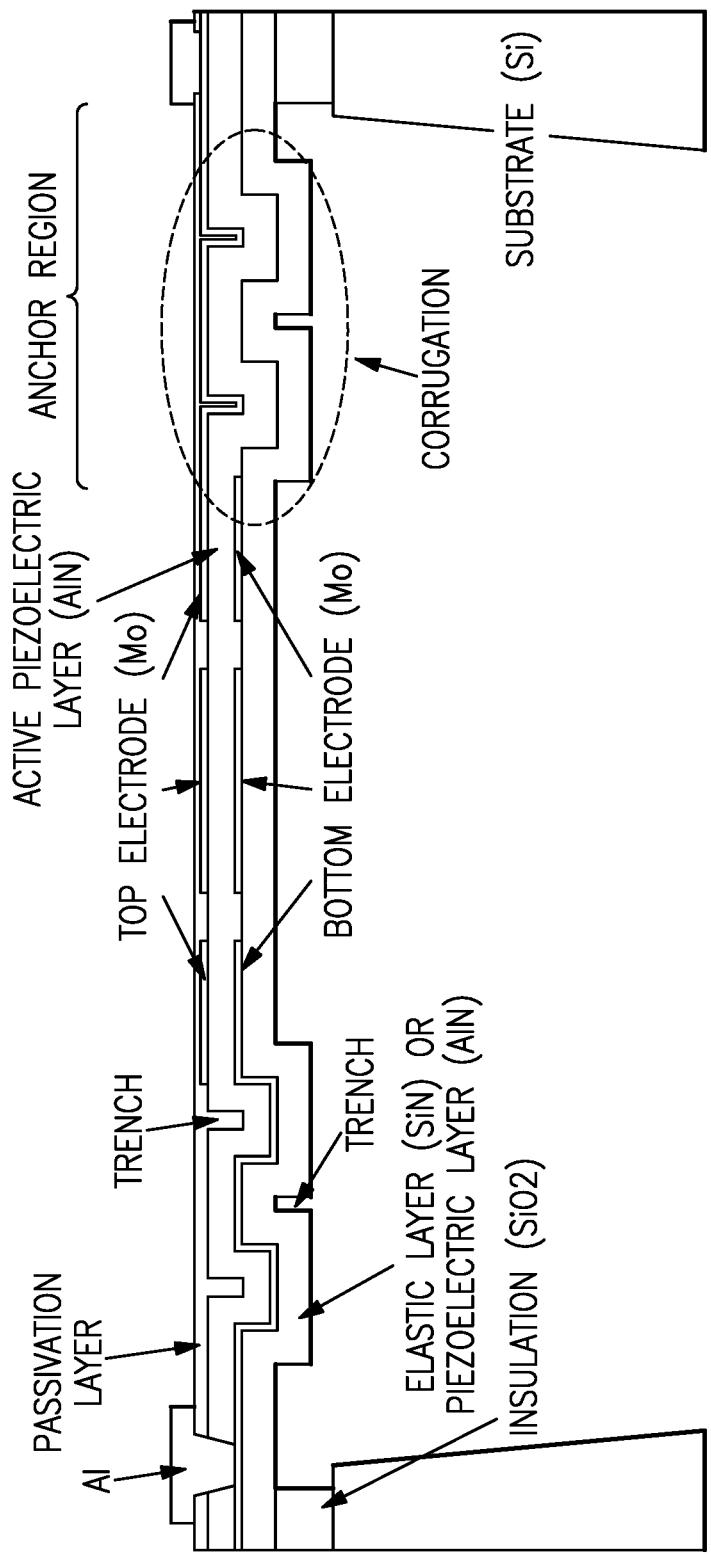
FIG. 2B is a cross-sectional view of the diaphragm PMM of FIG. 2A.

One example of a diaphragm PMM including a corrugated diaphragm is illustrated in a top-down plan view in FIG. 2A and in a cross-sectional view in FIG. 2B. The diaphragm of the piezoelectric MEMS microphone is corrugated around the perimeter to reduce the impact of residual stress on microphone sensitivity due to residual stress in the thin films forming the diaphragm. As noted above, after piezoelectric film or other elastic film deposition, either tensile or compressive residual stress can build up within the film, depending on their thermal expansion coefficient or due to variations in the manufacturing process. This tensile or compressive stress could be relieved by deformation of the corrugated structure. This results in a relatively residual stress-free diaphragm. The corrugated structure may provide for the diaphragm to be more easily displaced/vibrated by impingement of sound waves on the diaphragm, thus increasing its sensitivity.

In the example of the corrugated diaphragm PMM of FIGS. 2A and 2B, there are no middle electrodes such as in the embodiment of FIG. 1B. Rather, in the example of FIGS. 2A and 2B, there are upper and lower electrodes disposed on upper and lower surfaces of an active piezoelectric material film, and an elastic layer formed of, for example, silicon nitride, or an additional piezoelectric layer formed of, for example, aluminum nitride disposed below the lower electrodes below the active piezoelectric material film. However, examples including middle electrodes such as illustrated in FIG. 1B are also within the scope of this disclosure. A passivation layer formed of, for example, silicon nitride or aluminum nitride may be disposed on the upper electrodes and on top of the active piezoelectric material film.

As illustrated in FIG. 2B, corrugations are defined in the regions between the outer extent of the outer electrodes and the clamped perimeter of the diaphragm, also referred to as anchor regions of the diaphragm of the PMM, by portions of the active piezoelectric material film and the lower elastic or piezoelectric layer that are vertically displaced from one another. Trenches may be defined in the active piezoelectric material film and/or the lower elastic or piezoelectric layer to further define the corrugations and increase the compliance of the anchor regions and the ability of the anchor regions to deform to relieve residual stresses within the active piezoelectric material film and/or the lower elastic or piezoelectric layers. Examples of corrugated diaphragm PMMs may include a greater or fewer number of trenches than illustrated in FIG. 2B to achieve a desired amount of compliance in the diaphragm anchor region.

Figure 3B:
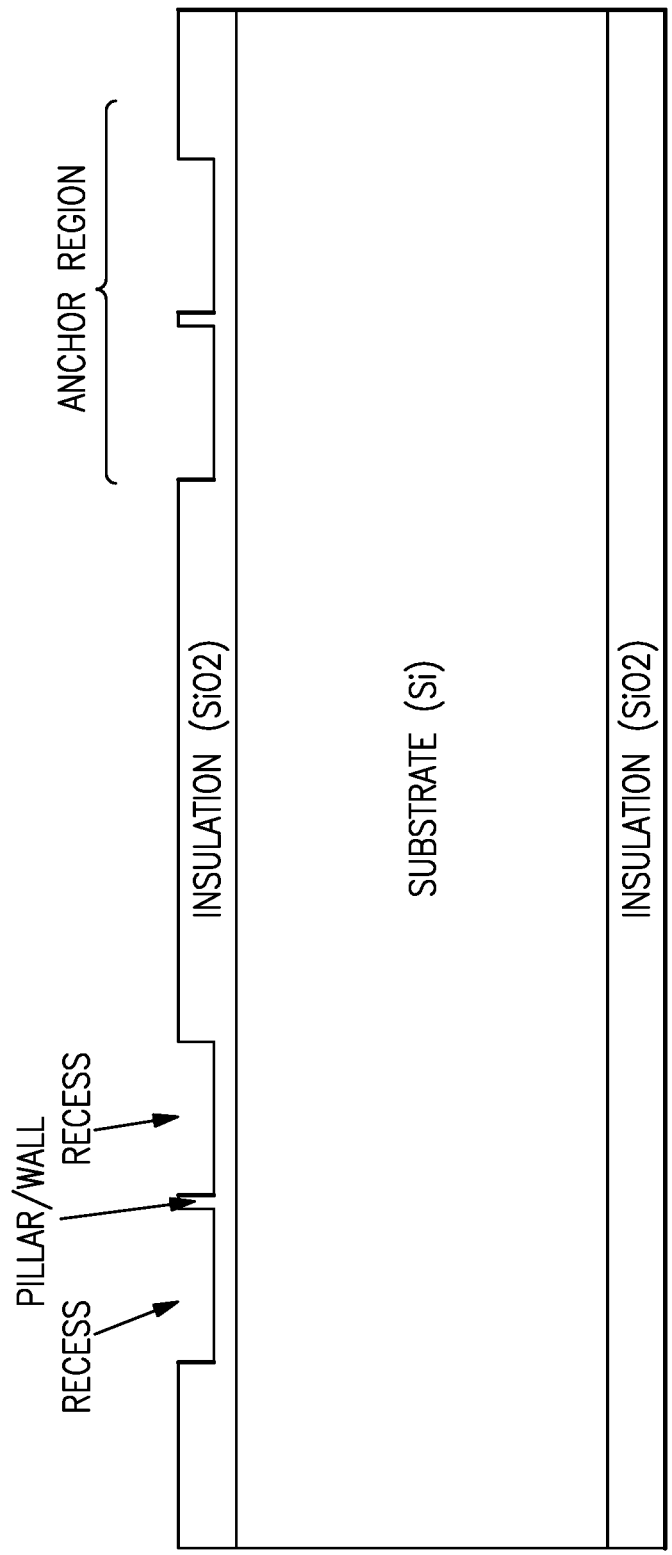
FIG. 3B illustrates another act in forming a diaphragm PMM including corrugations as disclosed herein.
Figure 3C:
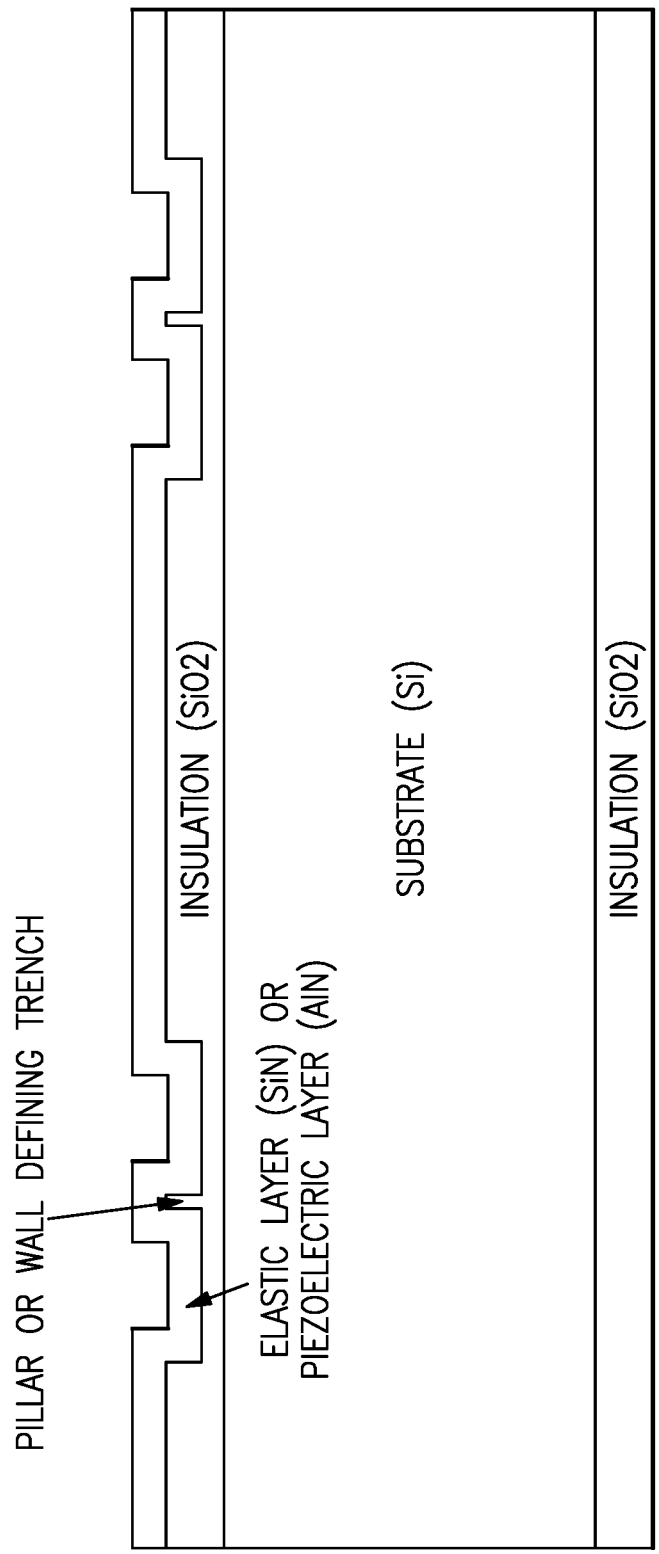
FIG. 3C illustrates another act in forming a diaphragm PMM including corrugations as disclosed herein.
Figure 3D:
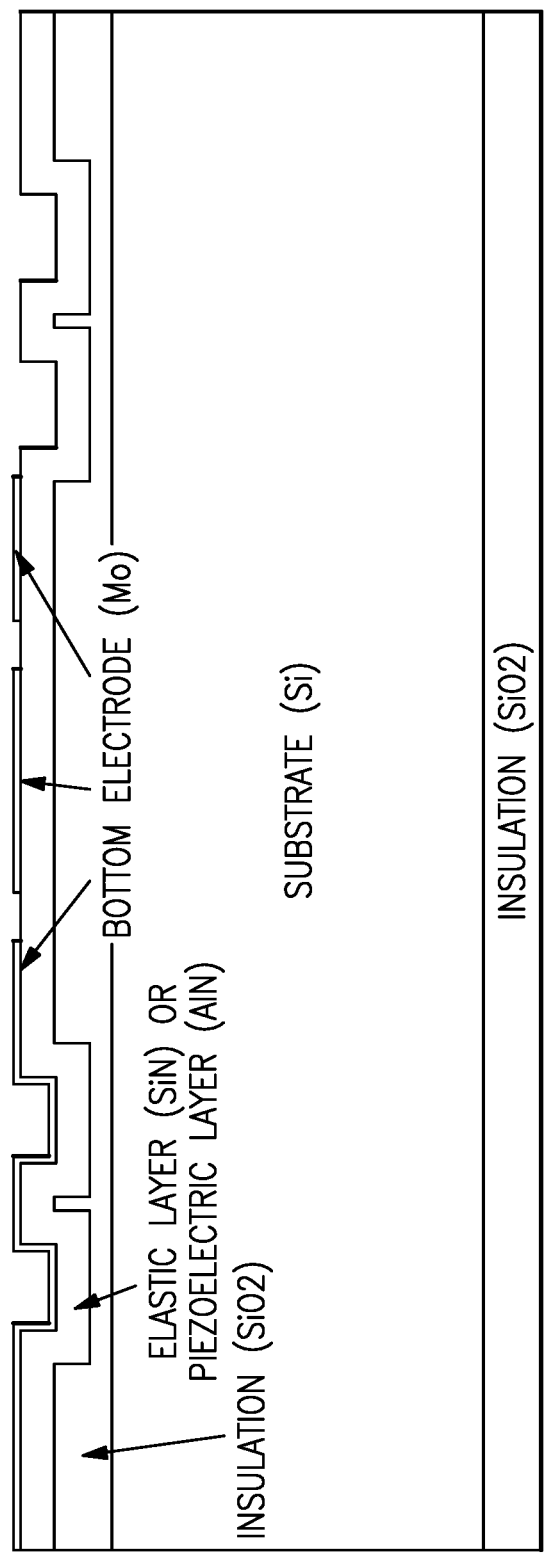
FIG. 3D illustrates another act in forming a diaphragm PMM including corrugations as disclosed herein.
Figure 3E:
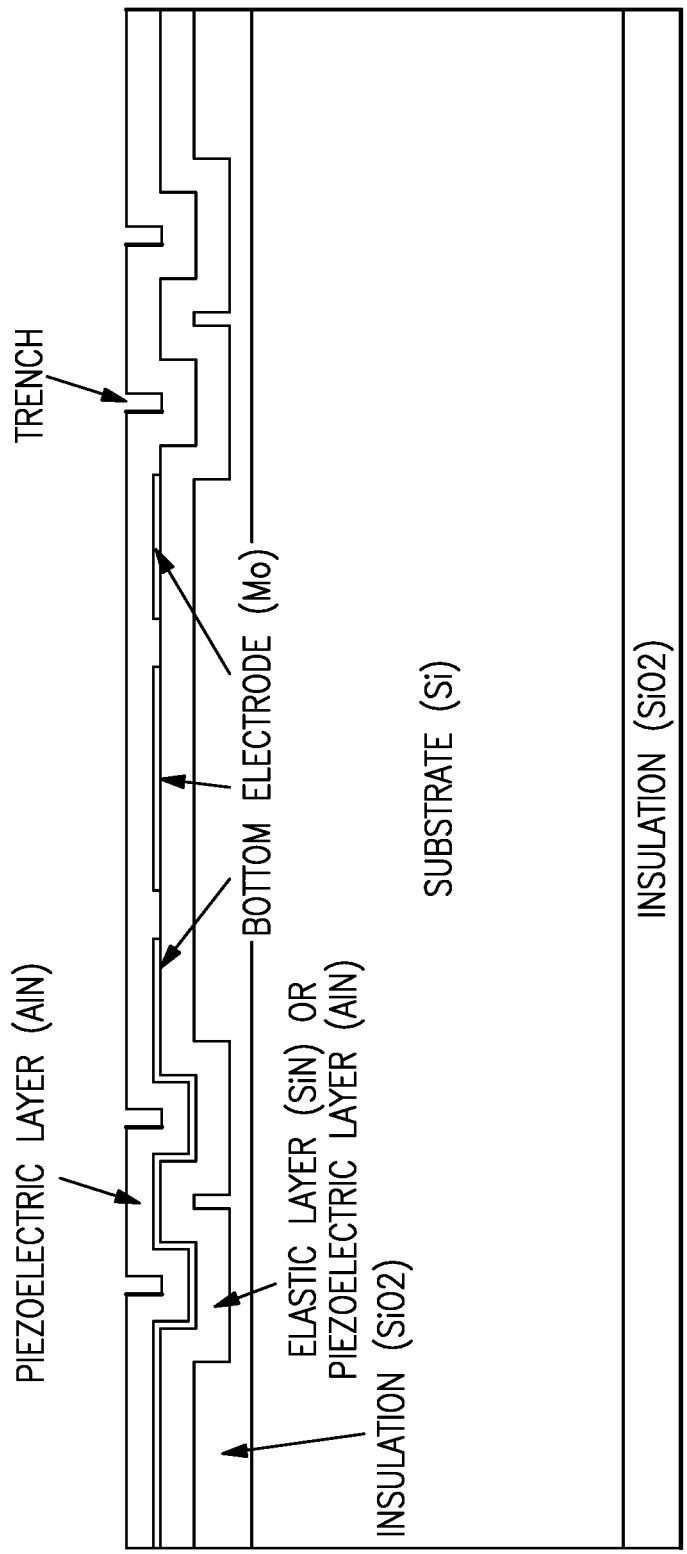
FIG. 3E illustrates another act in forming a diaphragm PMM including corrugations as disclosed herein.
Figure 3F:
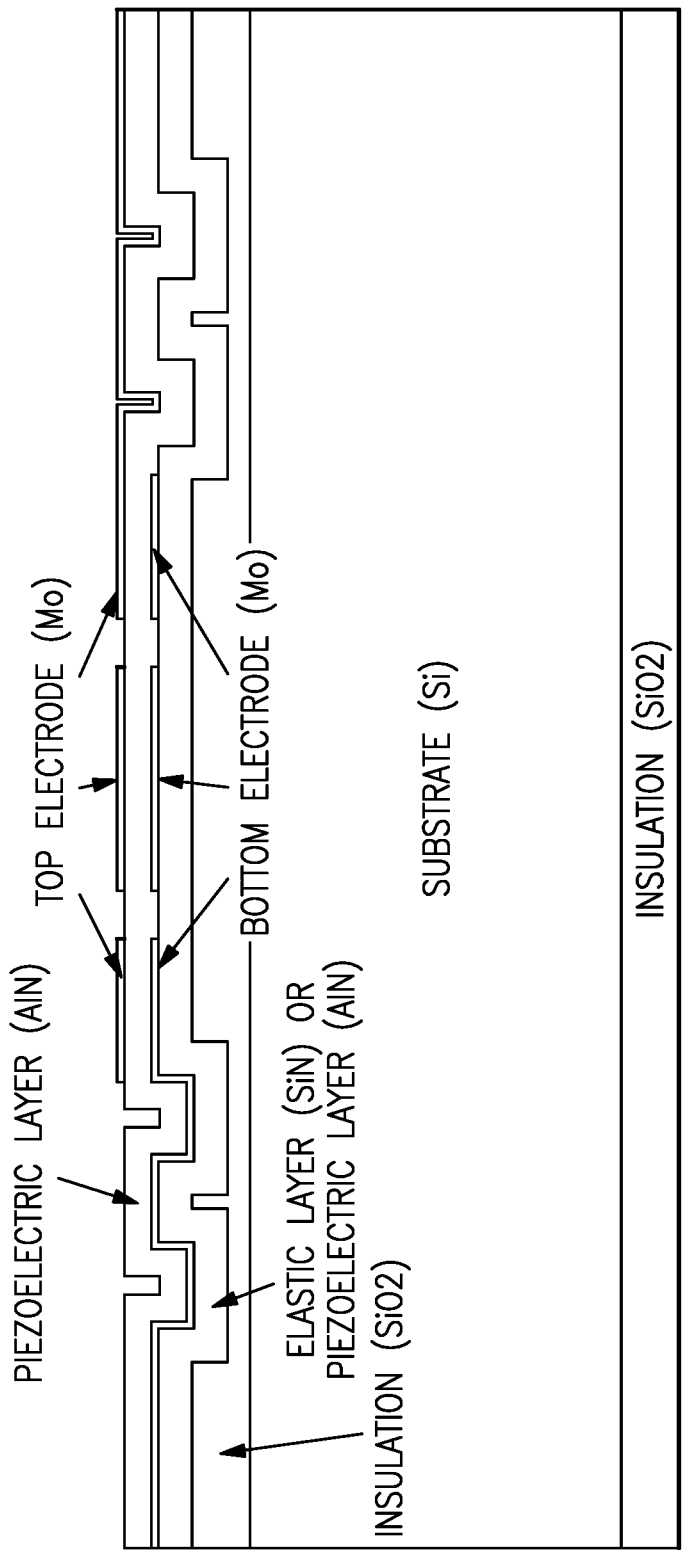
FIG. 3F illustrates another act in forming a diaphragm PMM including corrugations as disclosed herein.
Figure 3G:
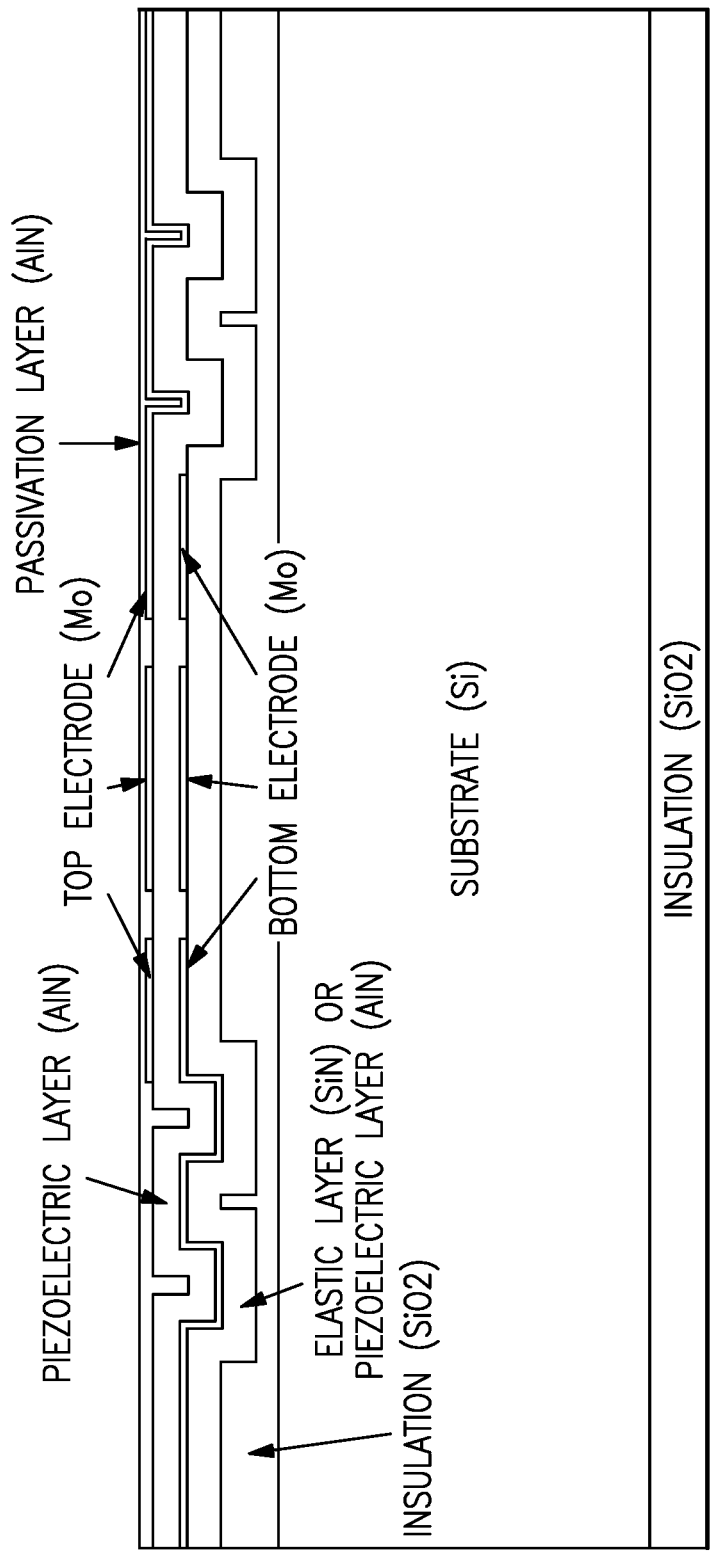
FIG. 3G illustrates another act in forming a diaphragm PMM including corrugations as disclosed herein.
Figure 3H:
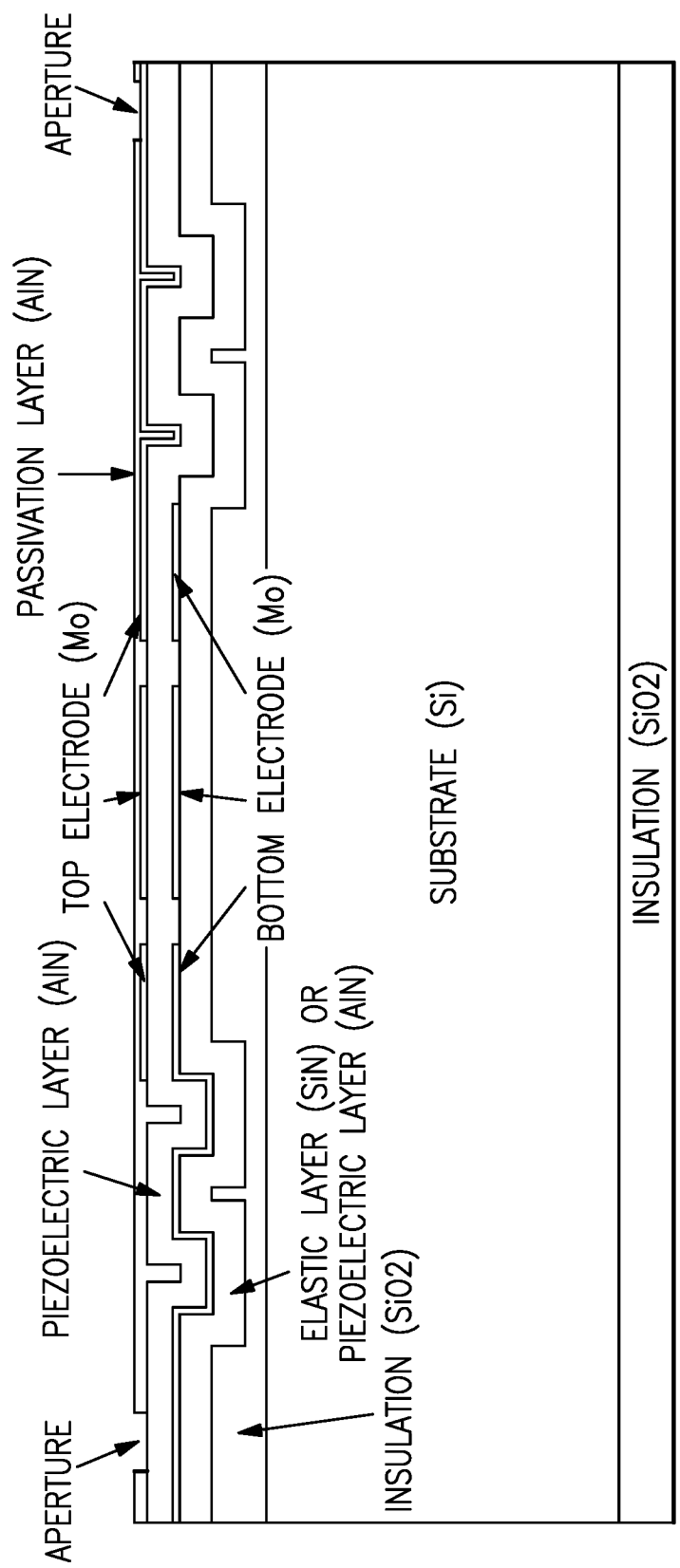
FIG. 3H illustrates another act in forming a diaphragm PMM including corrugations as disclosed herein.
Figure 3I:
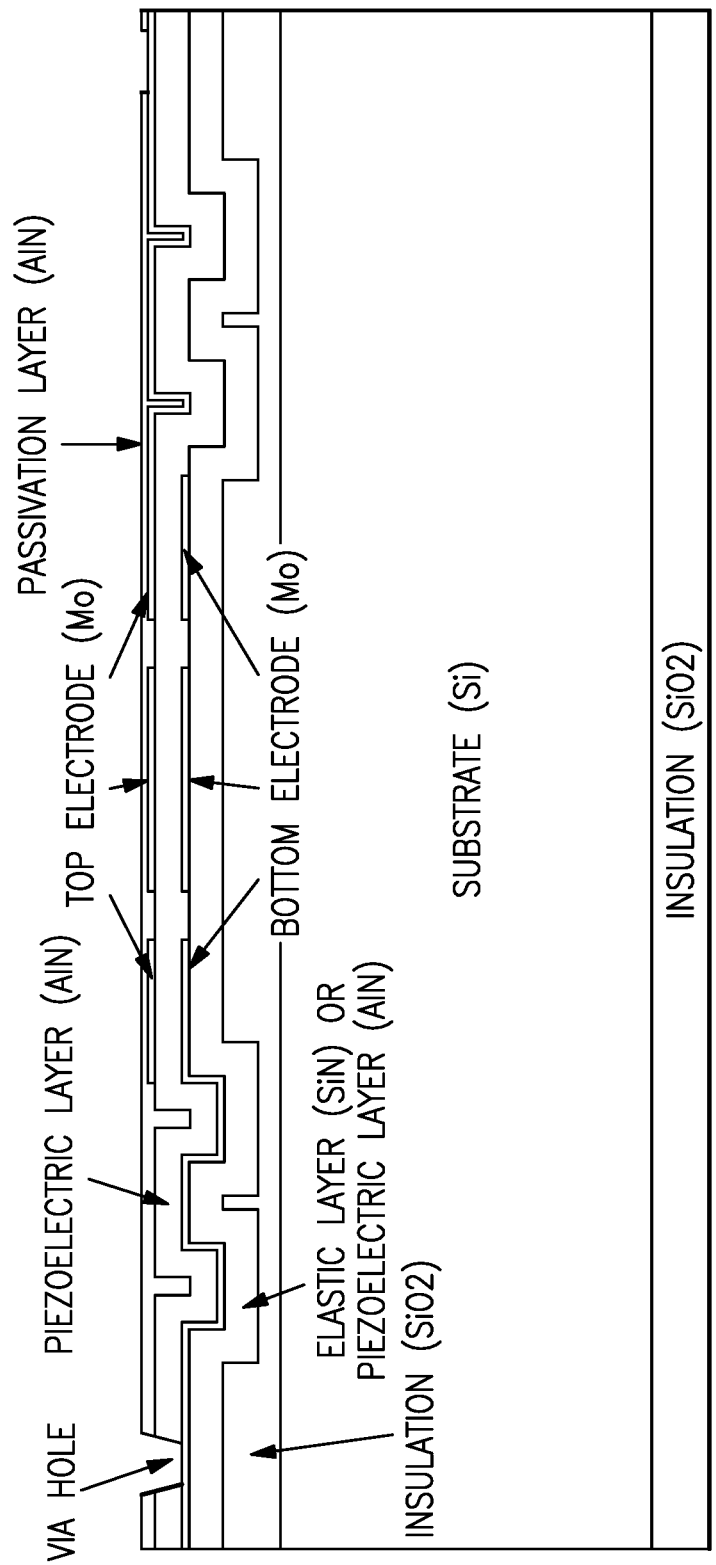
FIG. 3I illustrates another act in forming a diaphragm PMM including corrugations as disclosed herein.
Figure 3J:
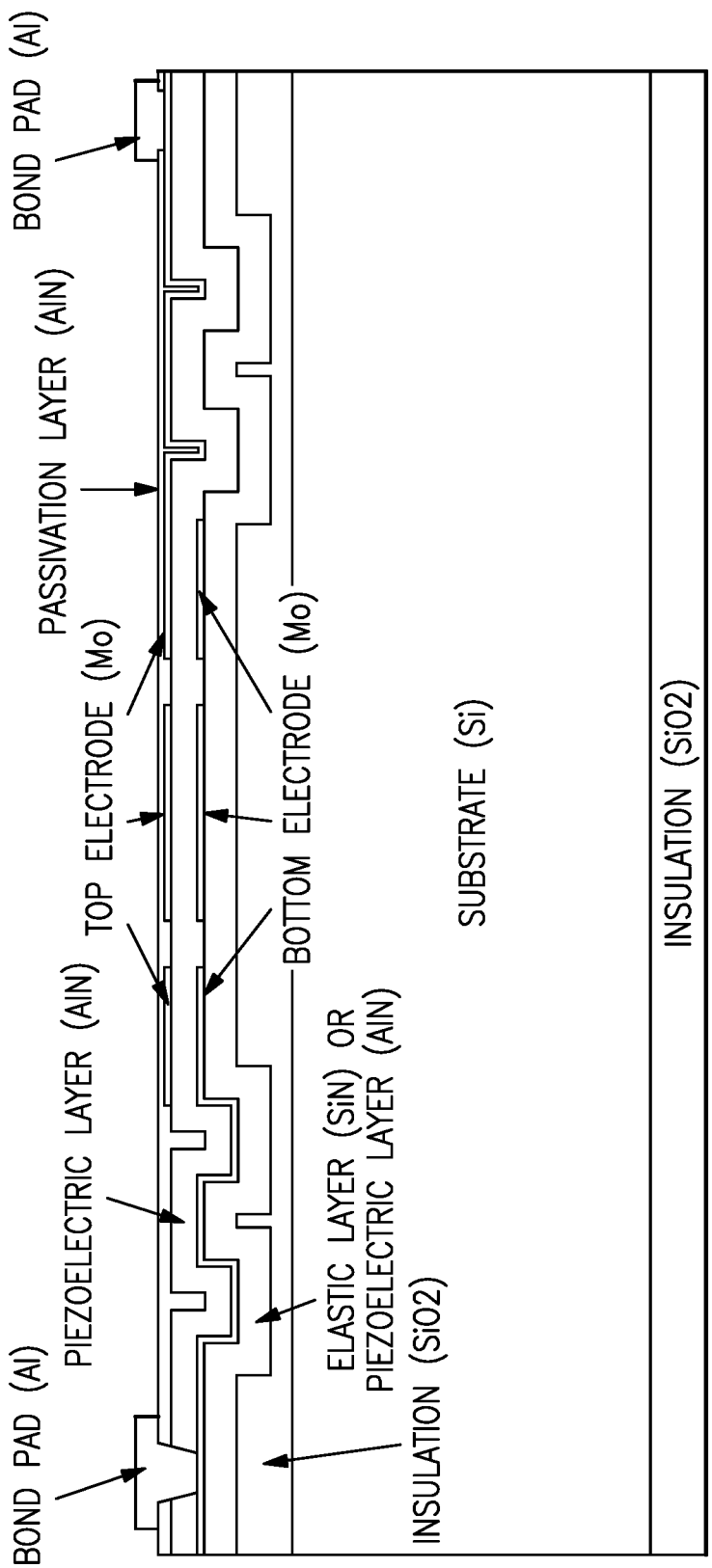
FIG. 3J illustrates another act in forming a diaphragm PMM including corrugations as disclosed herein.
Figure 3K:
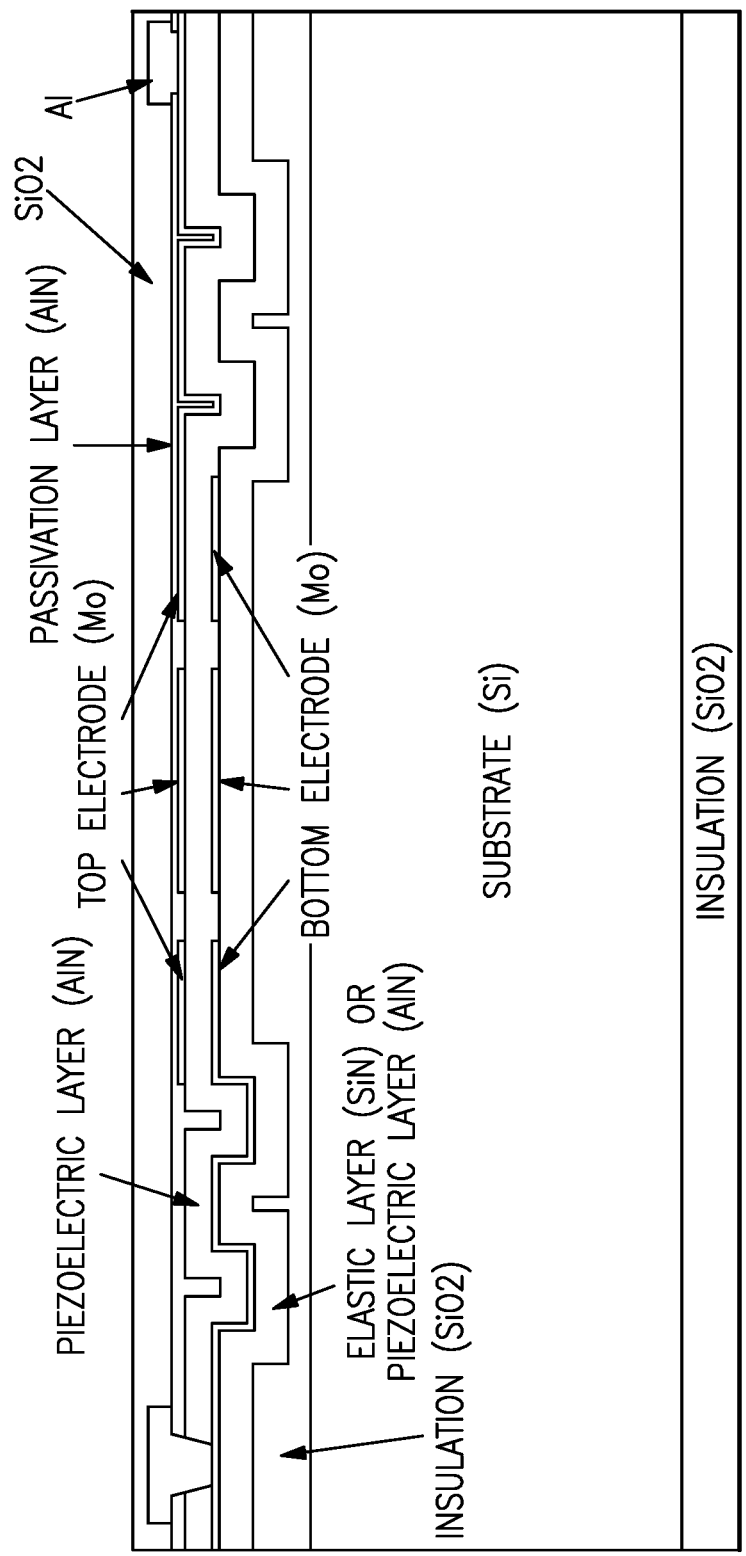
FIG. 3K illustrates another act in forming a diaphragm PMM including corrugations as disclosed herein.
Figure 3L:
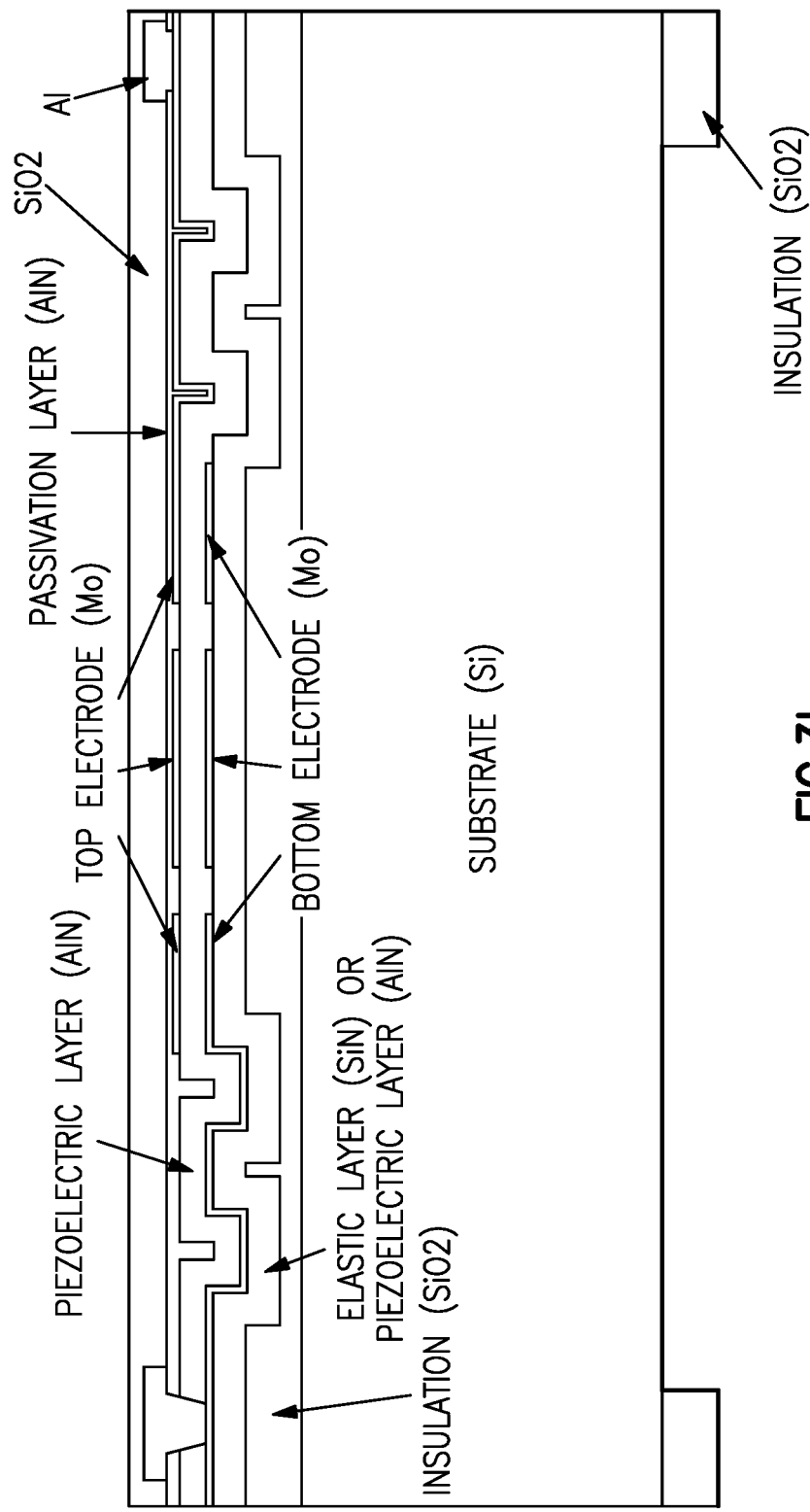
FIG. 3L illustrates another act in forming a diaphragm PMM including corrugations as disclosed herein.
Figure 3M:
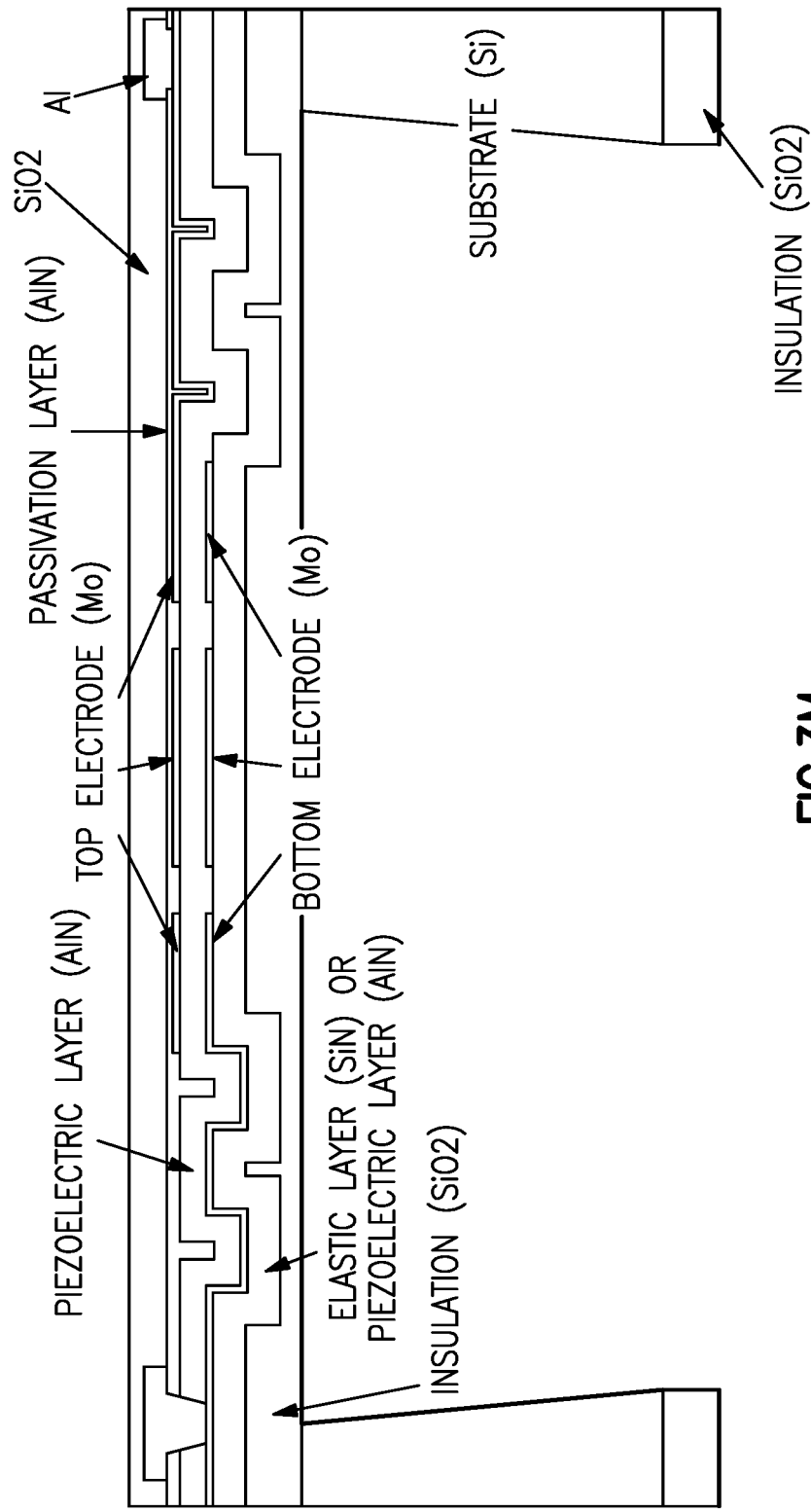
FIG. 3M illustrates another act in forming a diaphragm PMM including corrugations as disclosed herein.
Figure 3N:
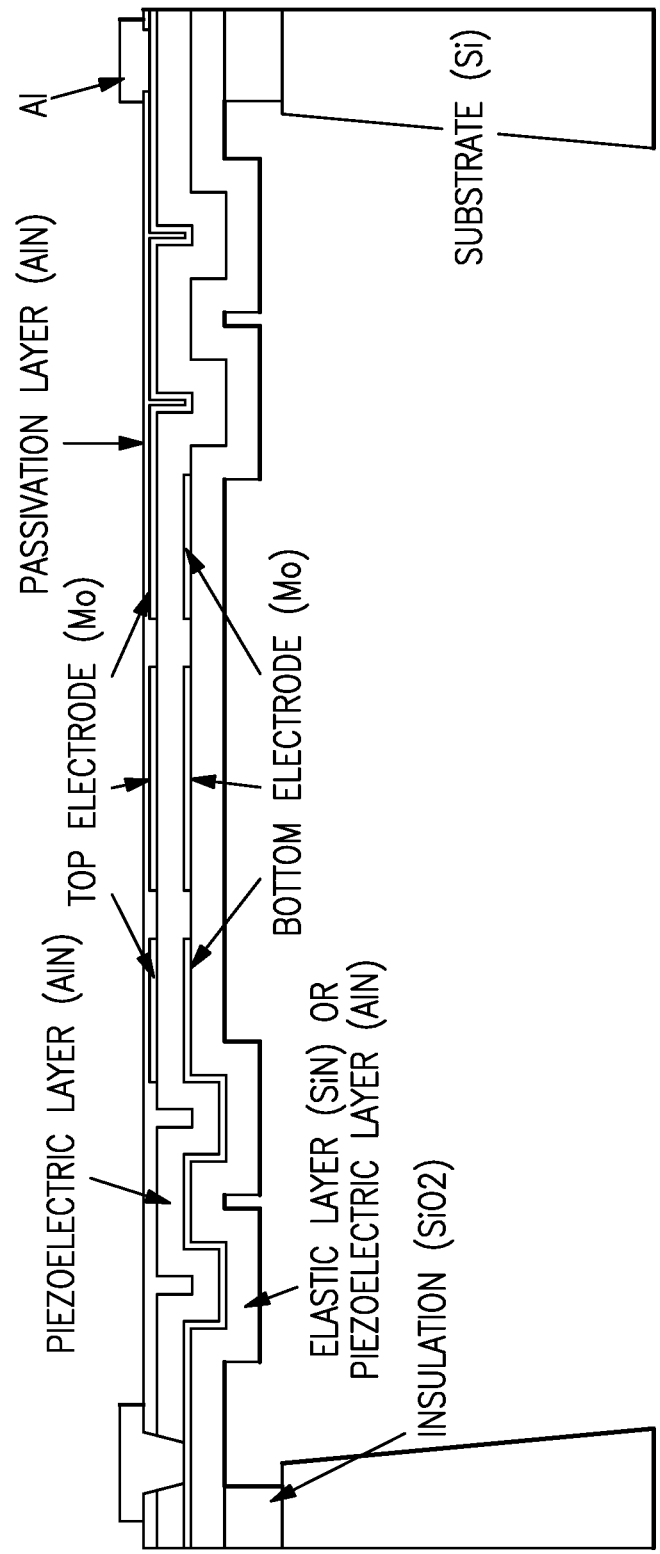
FIG. 3N illustrates another act in forming a diaphragm PMM including corrugations as disclosed herein.

Acts in a method of fabricating a corrugated diaphragm PMM are illustrated in FIGS. 3A-3N. As illustrated in FIG. 3A, one prepares a substrate, for example, a silicon wafer by depositing or growing insulating layers, for example, oxide layers on both the upper and lower surfaces of the wafer. In a following act, illustrated in FIG. 3B, recesses are etched, for example, by dry etching, in the insulating layer on the upper surface of the substrate. The recesses define pillars or walls that will be used to later define the trenches in the corrugated structure of the diaphragm. Although FIG. 3B illustrates two recesses and one pillar/wall formed in the areas that will become the anchor regions of the diaphragm, in other embodiments, additional recesses and pillars/walls may be formed.

In the act illustrated in FIG. 3C, an elastic layer of, for example, silicon nitride or a piezoelectric layer of, for example, aluminum nitride is deposited, for example, by chemical vapor deposition (CVD) on top of the insulating layer on the upper surface of the substrate. The elastic layer or piezoelectric layer is deposited around the pillars/walls previously formed in the insulating layer on the upper surface of the substrate to define what will be the trenches in the elastic layer or piezoelectric layer. Portions of the elastic or piezoelectric layer that are deposited over the pillars/walls in the insulating layer on the upper surface of the substrate are vertically displaced in an upward direction from portions of the elastic or piezoelectric layer that are deposited over the recesses in the insulating layer.

In the act illustrated in FIG. 3D, a conductive material that will form the bottom electrode of the diaphragm PMM is deposited on top of the elastic layer or piezoelectric layer and patterned, for example, by physical vapor deposition (PVD, e.g., sputtering or evaporation deposition) or electroplating, followed by dry or wet etching, or other metal deposition and patterning methods known in the art. The conductive material is indicated as being Mo in FIG. 3D, but could alternatively include or consist of Ru, Pt, or any other suitable electrode material.

In the act illustrated in FIG. 3E, a piezoelectric material that will form the active piezoelectric material film of the diaphragm PMM is deposited, for example, by CVD, on top of the bottom electrode and the lower elastic layer or piezoelectric layer. Trenches may then be formed, for example, by dry etching, in the active piezoelectric material film in what will become the anchor areas of the diaphragm PMM to define portions of the corrugation structure. Portions of the active piezoelectric material film that are deposited over the pillars/walls in the insulating layer on the upper surface of the substrate are vertically displaced in an upward direction from portions of the active piezoelectric material film that are deposited over the recesses in the insulating layer.

In the act illustrated in FIG. 3F, a conductive material that will form the top electrode of the diaphragm PMM is deposited on top of the active piezoelectric material layer and patterned, for example, by physical vapor deposition (PVD, e.g., sputtering or evaporation deposition) or electroplating, followed by dry or wet etching, or other metal deposition and patterning method known in the art. The conductive material is indicated as being Mo in FIG. 3F, but could alternatively include or consist of Ru, Pt, or any other suitable electrode material.

In the act illustrated in FIG. 3G, a dielectric material that will form a passivation layer on the upper surface of the diaphragm is deposited on top of the top electrode and active piezoelectric material layer by, for example a CVD process. The dielectric material is indicated in FIG. 3G as being aluminum nitride, but in other embodiments may include or consist of silicon nitride or any other suitable passivation layer material.

In a following act, illustrated in FIG. 3H, apertures are formed in the dielectric material layer, for example, by dry etching. Following formation of the apertures in the dielectric material layer, another etch, for example, a dry etch, is performed through one of the apertures to form a via hole though the active piezoelectric material layer to expose a portion of the top electrode material as illustrated in FIG. 3I. The via hole is filled with a conductive material, for example, aluminum by PVD, electroplating, or another suitable metal deposition and patterning method to form a bond pad in electrical communication with the bottom electrode. A bond pad is also formed in contact with the upper electrode through the other aperture in the passivation layer by a similar method or in the same step as formation of the bond pad in electrical communication with the bottom electrode. (FIG. 3J.)

In a further act, illustrated in FIG. 3K, a layer of dielectric material, for example, silicon dioxide is deposited by any suitable manner over the passivation layer and bond pads to protect the front side of the device during backside processing.

In a backside processing operation, illustrated in FIG. 3L, a portion of the dielectric material on the rear side of the substrate is etched away to form a window exposing the substrate. The substrate is then etched, for example, by dry etching, with the insulation layer acting as an etch stop. (FIG. 3M.) The protective front-side dielectric material and the central region of the rear side dielectric layer below the elastic or piezoelectric layer is etched away, for example, by wet etching to free the diaphragm and complete the diaphragm PMM structure. (FIG. 3N.) A portion of the rear side dielectric layer is left to couple the edges of the diaphragm to the remaining portions of the substrate which act as a support for the diaphragm.

Figure 4:
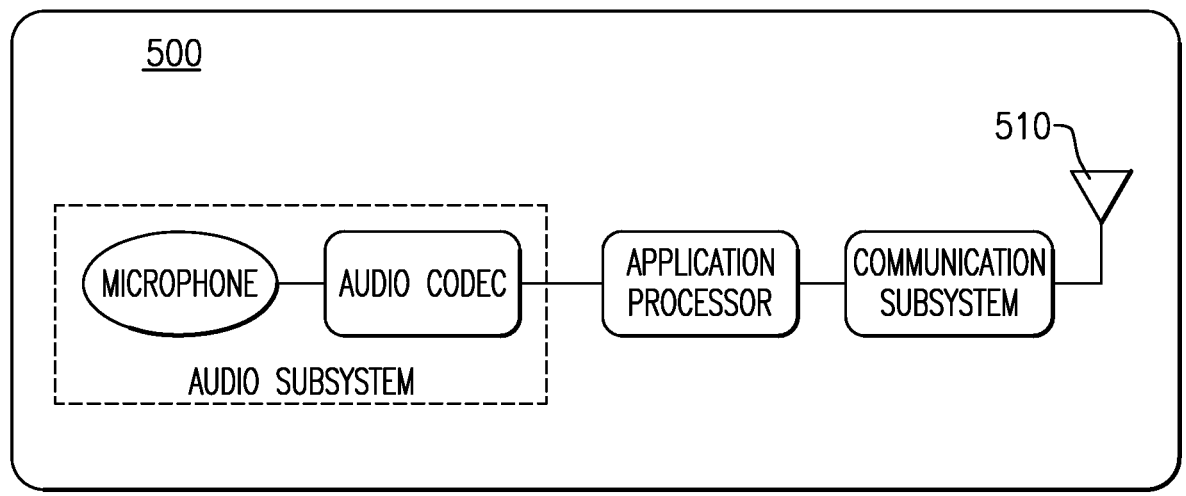
FIG. 4 is a block diagram of one example of a wireless device and that can include one or more piezoelectric MEMS microphones according to aspects of the present disclosure.

Examples of MEMS microphones as disclosed herein can be implemented in a variety of packaged modules and devices. FIG. 4 is a schematic block diagrams of an illustrative device 500 according to certain embodiments.

The wireless device 500 can be a cellular phone, smart phone, tablet, modem, communication network or any other portable or non-portable device configured for voice or data communication. The wireless device 500 can receive and transmit signals from an antenna 510.

The wireless device 500 may include one or more microphones as disclosed herein. The one or more microphones may be included in an audio subsystem including, for example, an audio codec. The audio subsystem may be in electrical communication with an application processor and communication subsystem that is in electrical communication with the antenna 510. As would be recognized to one of skill in the art, the wireless device would typically include a number of other circuit elements and features that are not illustrated, for example, a speaker, an RF transceiver, baseband sub-system, user interface, memory, battery, power management system, and other circuit elements.

The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures.

Any of the principles and advantages discussed herein can be implemented in association with RF circuits configured to process signals in a range from about 30 kHz to 10 GHz, such as in the X or Ku 5G frequency bands.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure.

For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A piezoelectric microelectromechanical system microphone comprising:
    a support substrate;
    a piezoelectric element configured to deform and generate an electrical potential responsive to impingement of sound waves on the piezoelectric element, the piezoelectric element attached to the support substrate about a perimeter of the piezoelectric element;
    a sensing electrode disposed on the piezoelectric element and configured to sense the electrical potential; and
    corrugations defined in the piezoelectric element about the perimeter of the piezoelectric element to release residual stress and improve sensitivity of the piezoelectric microelectromechanical system microphone.

2. The piezoelectric microelectromechanical system microphone of claim 1 wherein the piezoelectric element has a diaphragm structure.

3. The piezoelectric microelectromechanical system microphone of claim 2 wherein the piezoelectric element is circular.

4. The piezoelectric microelectromechanical system microphone of claim 2 wherein the corrugations are defined in an anchor region of the diaphragm structure.

5. The piezoelectric microelectromechanical system microphone of claim 4 wherein the corrugations include portions of the piezoelectric element displaced from one another in a direction normal to a plane defined by the perimeter of the piezoelectric element.

6. The piezoelectric microelectromechanical system microphone of claim 5 wherein the corrugations further include a trench defined in the piezoelectric element.

7. The piezoelectric microelectromechanical system microphone of claim 5 wherein the corrugations further include a plurality of trenches defined in the piezoelectric element.

8. The piezoelectric microelectromechanical system microphone of claim 2 wherein the sensing electrode includes an inner sensing electrode disposed proximate a center of the diaphragm structure and an outer sensing electrode disposed proximate the perimeter of the diaphragm structure.

9. The piezoelectric microelectromechanical system microphone of claim 8 wherein the corrugations are defined in a region of the piezoelectric element surrounding the outer sensing electrode.

10. The piezoelectric microelectromechanical system microphone of claim 1 further comprising an elastic layer disposed on a lower surface of the piezoelectric element.

11. The piezoelectric microelectromechanical system microphone of claim 10 wherein the corrugations include portions of the elastic layer displaced from one another in a direction normal to a plane defined by the perimeter of the piezoelectric element.

12. The piezoelectric microelectromechanical system microphone of claim 11 wherein the corrugations further include a trench defined in the elastic layer.

13. The piezoelectric microelectromechanical system microphone of claim 1 further comprising a piezoelectric material layer disposed on a lower surface of the piezoelectric element.

14. The piezoelectric microelectromechanical system microphone of claim 13 wherein the corrugations include portions of the piezoelectric material layer displaced from one another in a direction normal to a plane defined by the perimeter of the piezoelectric element.

15. The piezoelectric microelectromechanical system microphone of claim 14 wherein the corrugations further include a trench defined in the piezoelectric material layer.

16. An electronic device module including the piezoelectric microelectromechanical system microphone of claim 1.

17. An electronic device including the electronic device module of claim 16.

18. A cellular telephone including the electronic device module of claim 16.

19. A method of forming a piezoelectric microelectromechanical system microphone, the method comprising:
    depositing a film of piezoelectric material on a support substrate, the film of piezoelectric material secured to the support substrate about a perimeter of the film of piezoelectric material and including a central region defined within the perimeter that is free to vibrate responsive to impingement of sound waves on the central region;
    forming electrodes on one or both of upper and lower surfaces of the film of piezoelectric material within the central region; and
    forming corrugations in the film of piezoelectric material in an anchor region of the film of piezoelectric material.

20. The method of claim 19 wherein forming the corrugations includes forming one or more trenches in the film of piezoelectric material.

* * * * *